United States Patent
Chu et al.

(10) Patent No.: US 12,525,582 B2
(45) Date of Patent: Jan. 13, 2026

(54) SEMICONDUCTOR PACKAGE ASSEMBLY AND ELECTRONIC DEVICE

(71) Applicant: MEDIATEK INC., Hsinchu (TW)

(72) Inventors: Li-Huan Chu, Hsinchu (TW); Kai-Che Cheng, Hsinchu (TW); Ming-Tsung Lin, Hsinchu (TW); Sheng-Feng Liu, Hsinchu (TW); Chi-Ko Yu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 588 days.

(21) Appl. No.: 18/147,986

(22) Filed: Dec. 29, 2022

(65) Prior Publication Data
US 2023/0238360 A1   Jul. 27, 2023

Related U.S. Application Data

(60) Provisional application No. 63/301,512, filed on Jan. 21, 2022.

(51) Int. Cl.
*H01L 23/02* (2006.01)
*H01L 23/367* (2006.01)
*H01L 23/495* (2006.01)
*H01L 23/538* (2006.01)
(Continued)

(52) U.S. Cl.
CPC ........ *H01L 25/0657* (2013.01); *H01L 23/367* (2013.01); *H01L 23/49503* (2013.01);
(Continued)

(58) Field of Classification Search
CPC .............. H01L 25/0657; H01L 23/367; H01L 23/49503; H01L 23/5389; H01L 24/16;
(Continued)

(56) References Cited

U.S. PATENT DOCUMENTS

| | | |
|---|---|---|
| 10,867,928 B2 | 12/2020 | Lu et al. |
| 10,937,466 B2 | 3/2021 | Jeon |

(Continued)

FOREIGN PATENT DOCUMENTS

| | | |
|---|---|---|
| TW | 201935621 A | 9/2019 |
| TW | 202008545 A | 2/2020 |

(Continued)

OTHER PUBLICATIONS

Chinese language office action dated Oct. 16, 2023, issued in application No. TW 112101671.

*Primary Examiner* — Theresa T Doan
(74) *Attorney, Agent, or Firm* — McClure, Qualey & Rodack, LLP (57) ABSTRACT

A semiconductor package assembly and an electronic device are provided. The semiconductor package assembly includes a base, a system-on-chip (SOC) package, a memory package and a silicon capacitor die. The base has a first surface and a second surface opposite the first surface. The SOC package is disposed on the first surface of the base and includes a SOC die having pads and a redistribution layer (RDL) structure. The RDL structure is electrically connected to the SOC die by the pads. The memory package is stacked on the SOC package and includes a memory package substrate and a memory die. The memory package substrate has a top surface and a bottom surface. The memory die is electrically connected to the memory package substrate. The silicon capacitor die is disposed on and electrically connected to the second surface of the base.

31 Claims, 3 Drawing Sheets

(51) Int. Cl.
*H01L 25/065* (2023.01)
*H10B 80/00* (2023.01)
*H01L 23/00* (2006.01)

(52) U.S. Cl.
CPC ......... *H01L 23/5389* (2013.01); *H10B 80/00* (2023.02); *H01L 24/16* (2013.01); *H01L 24/48* (2013.01); *H01L 2224/16113* (2013.01); *H01L 2224/48195* (2013.01); *H01L 2924/30105* (2013.01)

(58) Field of Classification Search
CPC ........... H01L 24/48; H01L 2224/16113; H01L 2224/48195; H01L 2924/30105; H01L 23/5383; H01L 24/13; H01L 24/17; H01L 24/18; H01L 2225/1041; H01L 2225/1058; H01L 2225/107; H01L 23/36; H01L 23/427; H01L 23/50; H01L 23/5384; H01L 23/5385; H01L 2225/1094; H10B 80/00
USPC ........................................................ 257/686
See application file for complete search history.

(56) References Cited

U.S. PATENT DOCUMENTS

| | | | |
|---|---|---|---|
| 11,139,223 | B2 | 10/2021 | Yu et al. |
| 11,282,825 | B2 | 3/2022 | Lin et al. |
| 11,545,438 | B2* | 1/2023 | Hsieh ..................... H01L 24/20 |
| 11,587,894 | B2 | 2/2023 | Chen et al. |
| 11,728,254 | B2* | 8/2023 | Hou .................. H01L 23/49861 |
| | | | 257/737 |
| 2020/0273801 | A1 | 8/2020 | Kim |
| 2020/0303363 | A1 | 9/2020 | Yoo |
| 2021/0183842 | A1 | 6/2021 | Fay |
| 2021/0407942 | A1 | 12/2021 | Yu |
| 2022/0359406 | A1 | 11/2022 | Chen et al. |

FOREIGN PATENT DOCUMENTS

| | | |
|---|---|---|
| TW | 202038398 A | 10/2020 |
| TW | 202117952 A | 5/2021 |
| TW | 202145461 A | 12/2021 |
| TW | 202203335 A | 1/2022 |

* cited by examiner

SEMICONDUCTOR PACKAGE ASSEMBLY AND ELECTRONIC DEVICE

CROSS REFERENCE TO RELATED APPLICATIONS

This application claims the benefit of U.S. Provisional Application No. 63/301,512, filed Jan. 21, 2022, the entirety of which is incorporated by reference herein.

BACKGROUND OF THE INVENTION

Field of the Invention

The present invention relates to a semiconductor package assembly and an electronic device, and, in particular, to a semiconductor package assembly and an electronic device using a silicon capacitor as a heat sink.

Description of the Related Art

Package-on-package (PoP) assembly is an integrated circuit packaging method to combine vertically discrete system-on-chip (SOC) and memory packages. Two or more packages are installed on top of each other, i.e., stacked, with a standard interface to route signals between them. This allows higher component density in devices, such as mobile phones, personal digital assistants (PDA), and digital cameras.

Improved thermal dissipation, fine-pitch, fine-size routings, and package height shrinkage are important ways of improving the electrical performance of high-end smartphone applications.

Thus, a novel electronic device that includes a semiconductor package assembly is desirable.

BRIEF SUMMARY OF THE INVENTION

An embodiment of the present invention provides a semiconductor package assembly. The semiconductor package assembly includes a base, a system-on-chip (SOC) package, a memory package, and a silicon capacitor die. The base has a first surface and a second surface opposite the first surface. The system-on-chip (SOC) package is disposed on the first surface of the base. The system-on-chip (SOC) package includes a system-on-chip (SOC) die and a redistribution layer (RDL) structure. The system-on-chip (SOC) die has pads. The redistribution layer (RDL) structure is electrically connected to the system-on-chip (SOC) die by the pads. The memory package is stacked on the SOC package. The memory package includes a memory package substrate and a memory die. The memory package substrate has a top surface and a bottom surface. The memory die is mounted on the top surface of the memory package substrate and electrically connected to the memory package substrate. The silicon capacitor die is disposed on and electrically connected to the second surface of the base.

An embodiment of the present invention provides an electronic device. The electronic device includes a first base, a system-on-chip (SOC) package, a memory package, a silicon capacitor die, a heat dissipating feature and a screen. The first base has a first surface and a second surface opposite the first surface. The system-on-chip (SOC) package is disposed on the first surface of the base. The system-on-chip (SOC) package includes a system-on-chip (SOC) die and a redistribution layer (RDL) structure. The system-on-chip (SOC) die has pads. The redistribution layer (RDL) structure is electrically connected to the system-on-chip (SOC) die by the pads. The memory package is stacked on the SOC package. The memory package includes a memory package substrate and a memory die. The memory package substrate has a top surface and a bottom surface. The memory die is mounted on the top surface of the memory package substrate and electrically connected to the memory package substrate. The silicon capacitor die is disposed on the second surface of the base. The heat dissipating feature is connected to the silicon capacitor die. The screen is disposed over the heat dissipating feature.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
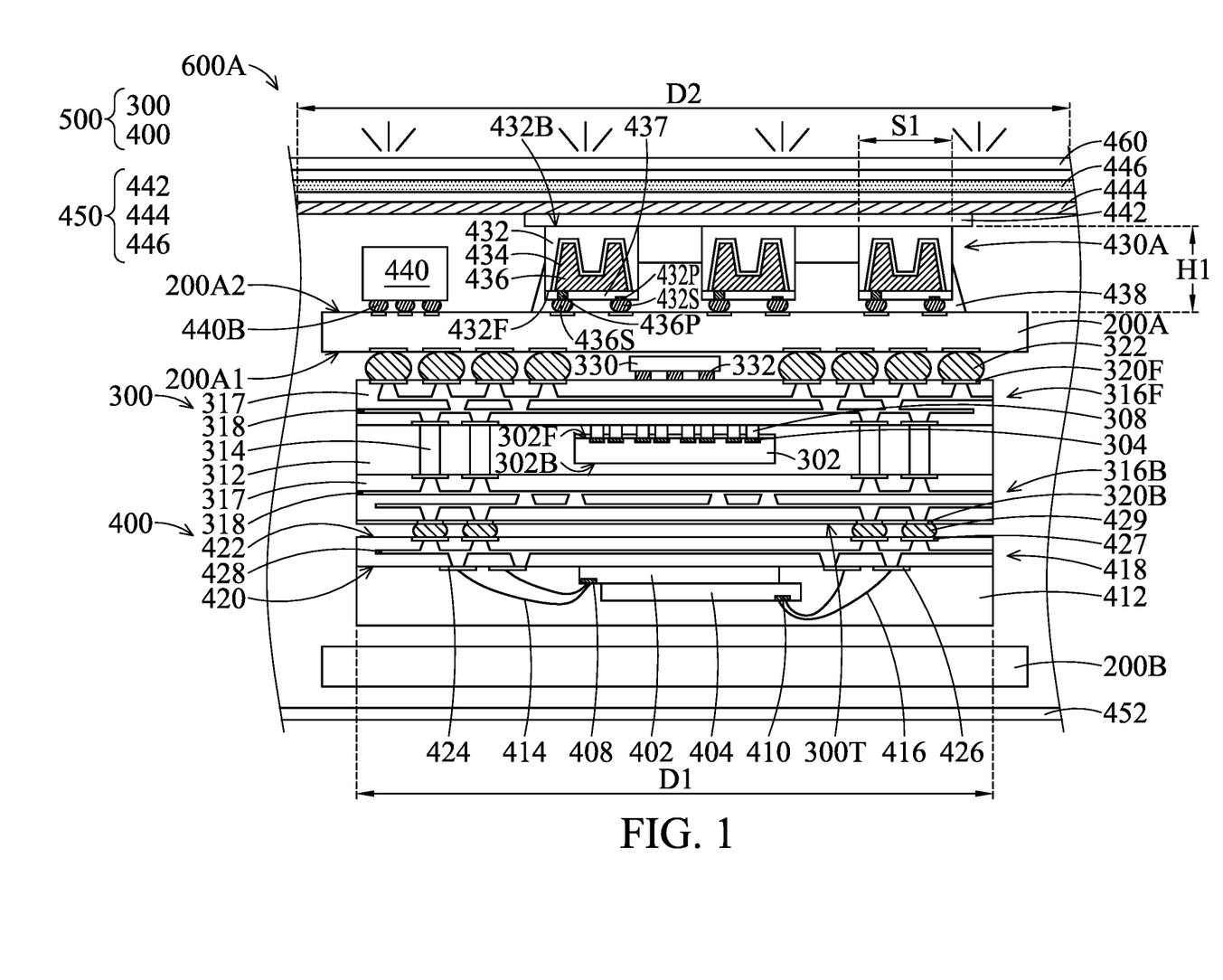
FIGS. 1-3 are cross-sectional views of an electronic device comprising a semiconductor package assembly in accordance with some embodiments of the disclosure.

FIG. 1 is a cross-sectional view of an electronic device 600A comprising a semiconductor package assembly 500 in accordance with some embodiments of the disclosure. In some embodiments, the electronic device 600A is a portion of mobile phones, personal digital assistants (PDA), and digital cameras. As shown in FIG. 1, the electronic device 600A includes bases 200A and 200B, the semiconductor package assembly 500, silicon capacitor dies 400A, a heat dissipating feature 450, a back plate 452 and a screen 460.

In some embodiments, the semiconductor package assembly 500 is a three-dimensional (3D) package-on-package (PoP) semiconductor package assembly. The semiconductor package assembly 500 may include at least two vertically stacked wafer-level semiconductor packages mounted on the base 200A and disposed between the bases 200A and 200B. As shown in FIG. 1, in some embodiments, the semiconductor package assembly 500 includes a system-on-chip (SOC) package 300 and a memory package 400 vertically stacked on the SOC package 300.

As shown in FIG. 1, the bases 200A and 200B and disposed between a space between the back plate 452 and the screen 460. The back plate 452 is disposed over the semiconductor package assembly 500 opposite the screen 460. The back plate 452 is used to cover and protect the bases 200A and 200B, the semiconductor package assembly 500, the silicon capacitor dies 400A and the heat dissipating feature 450 inside the electronic device 600A. The screen 460 may act the assembly of both an input (e.g., a touch panel) and output (e.g., a display) device. Each of the bases 200A and 200B, for example a printed circuit board (PCB), may be formed of polypropylene (PP). It should also be noted that the bases 200A and 200B can be a single layer or a multilayer structure. The base 200A has a first surface 200A1 and a second surface 200A2 opposite the first surface 200A1. The base 200A is provided for the semiconductor package assembly 500 disposed on the first surface 200A1. The base 200B is disposed over the first surface 200A1 of the base 200A and electrically connected to the base 200A.

As shown in FIG. 1, a plurality of pads (not shown) and/or conductive traces (not shown) is disposed on the first surface 200A1 of the base 200A. In one embodiment, the conductive traces may comprise signal trace segments or ground trace segments, which are used for the input/output (I/O) connections of the SOC package 300 and the memory package 400. Also, the SOC package 300 is mounted directly on the conductive traces. In some other embodiments, the pads are disposed on the first surface 200A1 of the base 200A, connected to different terminals of the conductive traces. The pads are used for the SOC package 300a that is mounted directly on them.

The SOC package 300 is disposed on the first surface 200A1 of the base 200A. The SOC package 300 includes a system on chip (SOC) die 302 and a redistribution layer (RDL) structure 316F. For example, the system on chip (SOC) die 302 may include a logic die including a central processing unit (CPU), a graphic processing unit (GPU), a dynamic random access memory (DRAM) controller or any combination thereof.

As shown in FIG. 1, the SOC die 302 has a back surface 302B and a front surface 302F. The SOC die 302 is fabricated by a flip-chip technology. The back surface 302B of the SOC die 302 may be close to a top surface 300T of the SOC package 300. Pads 304 of the SOC die 302 are disposed on the front surface 302F to be electrically connected to the circuitry (not shown) of the SOC die 302. In some embodiments, the pads 304 belong to the uppermost metal layer of the interconnection structure (not shown) of the SOC die 302. The pads 304 of the SOC die 302 are in contact with the corresponding vias 308. The SOC die 302 is connected to the redistribution layer (RDL) structure 316 by vias 308.

The redistribution layer (RDL) structure 316F (e.g., a front-side RDL structure) is disposed on the front surface 302F of the SOC die 302. In some other embodiments, the SOC package 300 further includes a redistribution layer (RDL) structure 316B (e.g., a bask-side RDL structure) disposed on the back surface 302B of the SOC die 302. The RDL structure 316F is electrically connected to the SOC die 302 by the pads 304 of the SOC die 302 and the vias 308. In some embodiments, each of the RDL structures 316F and 316B may have one or more conductive traces 318 disposed in one or more intermetal dielectric (IMD) layers 317. The conductive traces 318 are electrically connected to corresponding RDL contact pads 320F and 320B of the RDL structures 316F and 316B. The RDL contact pads 320F and 320B are exposed to openings of corresponding solder mask layers (not shown). However, it should be noted that the number of conductive traces 318, the number of IMD layers 317 and the number of RDL contact pads 320F and 320B shown in FIG. 1 is only an example and is not a limitation to the present invention.

As shown in FIG. 1, the SOC package 300 further includes conductive structures 322 disposed between the redistribution layer (RDL) structure 316F and the base 200A. The conductive structures 322 are disposed on and in contact with the RDL contact pads 320F away from the SOC die 302. In some embodiments, the conductive structures 322 may comprise a conductive bump structure such as a copper bump or a solder bump structure, a conductive pillar structure, a conductive wire structure, or a conductive paste structure.

As shown in FIG. 1, the SOC package 300 further includes a molding compound 312 disposed between the RDL structures 316F and 316B. The molding compound 312 surrounds the SOC die 302, and fills any gaps around the SOC die 302 and between the RDL structures 316F and 316B. The molding compound 312 is in contact with the redistribution layer (RDL) structures 316F and 316B and the SOC die 302. In some embodiments, the molded compound 312 may be formed of a nonconductive material, such as an epoxy, a resin, a moldable polymer, or the like. The molding compound 312 may be applied while substantially liquid, and then may be cured through a chemical reaction, such as in an epoxy or resin. In some other embodiments, the molding compound 312 may be an ultraviolet (UV) or thermally cured polymer applied as a gel or malleable solid capable of being disposed around the SOC die 302, and then may be cured using a UV or thermally curing process. The molding compound 312 may be cured with a mold.

As shown in FIG. 1, the SOC package 300 further includes conductive structures 314 passing through the molding compound 312 and electrically connected to the RDL structures 316F and 316B, the SOC die 302 and the memory package 400. The conductive structures 314 are disposed between the RDL structures 316F and 316B. The conductive structures 314 and the SOC die 302 may be disposed side-by-side. In addition, the conductive structures 314 may be disposed as an array along parallel edges (not shown) of the SOC package 300. Therefore, the SOC die 302 is disposed between the conductive structures 314. In some embodiments, the conductive structures 314 may comprise a through via (TV) structure, or a conductive pillar structure such as a copper pillar structure.

As shown in FIG. 1, the SOC package 300 further includes an electronic component 330 mounted on the RDL structure 316F opposite the SOC die 302. In some embodiments, the electronic component 330 has pads 332 on it and is electrically connected to the conductive traces 318 of the RDL structure 316F. In some embodiments, the electronic component 330 is arranged between the conductive structures 322. The electronic component 330 does not need to be covered by a molding compound. In some embodiments, the electronic component 330 comprises integrated passive device (IPD) including a capacitor, an inductor, a resistor, or a combination thereof. In some embodiments, the electronic component 330 comprises dynamic random access memory (DRAM) dies.

As shown in FIG. 1, the memory package 400 is stacked on the SOC package 300 by a bonding process. In some embodiments, the memory package 400 comprises a dynamic random access memory (DRAM) package or another applicable memory package. In some embodiments, the memory package 400 includes a memory package substrate 418, conductive structures 429 and at least one memory die, for example, two memory dies 402 and 404 that are stacked on the memory package substrate 418. In some embodiments, the memory die 402 comprises a dynamic random access memory (DRAM) die or another applicable memory die. The memory package substrate 418 has a top surface 420 and a bottom surface 422. For example, the top surface 420 may serve as a die-attach surface 420, and the bottom surface 422 may serve as a bump-attach surface 422 opposite the die-attach surface 420. In this embodiment, as shown in FIG. 1, there are two memory dies 402 and 404 mounted on the top surface (die-attach surface) 420 of the memory package substrate 418. The memory die 404 having a pad 410 is stacked on the memory die 402 having a pad 408 using a paste (not shown), and the memory die 402 is mounted on die-attach surface 420 of the memory package substrate 418 by a paste (not shown). In some other embodiments, the memory dies 402 and 404 are electrically connected to the memory package substrate 418 using conductive structures, for example, bonding wires 414 and 416, connected to the pads 408 and 410. In some other embodiments, the memory dies 402 and 404 are electrically connected to the memory package substrate 418 using other applicable conductive structures, for example, conductive bump structures (such as a copper bump or a solder bump structure), conductive pillar structures, or a conductive paste structure. However, the number of stacked memory dies is not limited to the disclosed embodiment. Alternatively, the memory dies 402 and 404 as shown in FIG. 1 can be arranged side by side. Therefore, the memory dies 402 and 404 are mounted on the top surface (die-attach surface) 420 of the memory package substrate 418 by paste.

As shown in FIG. 1, the memory package substrate 418 may comprise a circuitry 428 and metal pads 424 and 426 and 427. The metal pads 424 and 426 are disposed on the top of the circuitry 428 close to the top surface (die-attach surface) 420. The metal pads 427 are disposed on the bottom of the circuitry 428 close to the bottom surface (bump-attach surface) 422 of the memory package substrate 418. The circuitry 428 of the memory package 400 is interconnected to the conductive traces 318 of the RDL structure 316B via the conductive structures 429 disposed on the bottom surface (bump-attach surface) 422 of the memory package substrate 418. In some embodiments, the conductive structures 429 of the memory package 400 are electrically coupled to the conductive traces 318 of the RDL structure 316F of the SOC package 300 by the RDL structure 316B and the conductive structures 314 passing through the molding compound 312 between the memory package 400 and the RDL structure 316F of the SOC package 300. In some embodiments, the conductive structures 429 may comprise a conductive bump structure such as a copper bump or a solder bump structure, a conductive pillar structure, or a conductive paste structure.

In some embodiments, as shown in FIG. 1, the memory package 400 further includes a molding material 412 covering the top surface 420 of the memory package substrate 418, encapsulating the memory dies 402 and 404 and the bonding wires 414 and 416. The molding materials 312 and 412 may comprise the same or similar materials and fabrication processes.

As shown in FIG. 1, one or more discrete silicon capacitor dies 430A are disposed on and electrically connected to the second surface 200A2 of the base 200A opposite the semiconductor package assembly 500. The silicon capacitor die 400A is formed from a silicon substrate 432 and formed by the semiconductor processes. In some embodiments, the silicon capacitor dies 400A may include a first electrode (i.e., the silicon substrate 432), a dielectric material 434, a second electrode 436, a passivation layer 437, a first electrode pad 432P, a second electrode pad 436P and conductive structures 432S and 436S. The silicon substrate 432 has a front surface (bump-attach surface) 432F and a back surface 432B. In addition, the silicon substrate 432 has trenches (not shown) formed from the front surface 432F and extends into a portion of the silicon substrate 432. The dielectric material 434 lines the trenches. The second electrode 436 formed of doped silicon or conductive materials fills the trenches and covers the dielectric material 434, so that the dielectric material 434 is sandwiched between the first electrode formed of the silicon substrate 432 and the second electrode 436. The passivation layer 437 covers the silicon substrate 432 and the second electrode 436. The first electrode pad 432P is disposed on the passivation layer 437 and electrically connected to the silicon substrate 432. The second electrode pad 436 is disposed on the passivation layer 437 and electrically connected to the second electrode 436. The conductive structures 432S and 436S are disposed on the front surface (bump-attach surface) 432F of the silicon substrate 432 and electrically connected to the corresponding electrode pads 432P and 436P. In some embodiments, the back surface 432B of the silicon substrate forms the top surface of the silicon capacitor die 430A away from the conductive structures 432S and 436S. In some embodiments, the conductive structures 314, 332, 429, 432S and 436S may have the same or similar structures.

In some embodiments, the silicon capacitor die 400A has a thermal conductivity (about 150 W/m·K) much higher than a thermal conductivity of air (about 0.026 W/m·K). In some embodiments, the silicon capacitor die 400A formed by silicon row material can have a desired height (can reach about 700 μm) much greater than that of the conventional MLCC component. Therefore, the silicon capacitor die 400A may be in contact with the heat dissipating feature 450 and serve as an in-situ heat sink to directly dissipate the heat from the system-on-chip (SOC) package 300 to the screen 460.

As shown in FIG. 1, the electronic device 600A further includes an underfill 438 filling the gap between the silicon capacitor die 430A and the base 200A to reduce the thermal resistance from the SOC package 300 to the silicon capacitor die 430A. In addition, the underfill 438 may fill the gap between the adjacent silicon capacitor dies 430A. The conductive structures 432S and 436S are surrounded by the underfill 438 between the silicon capacitor die 430A and the base 200A. In some embodiments, the underfill 438 may surrounds and is in contact with a portion of the silicon substrate 432 to further reduce the thermal resistance from the SOC package 300 to the silicon capacitor die 430A. In some embodiments, the underfill 438 includes a capillary underfill (CUF), a molded underfill (MUF), or a combination thereof.

As shown in FIG. 1, the electronic device 600A further includes one or more discrete electrical components 440 disposed on the second surface 200A2 of the base 200A and beside the silicon capacitor die 400A. In some embodiments, the electrical component 440 is electrically connected to the base 200A using conductive structures 440B. In some embodiments, the electronic component 440 comprises a power management integrated circuit (PMIC). In some embodiments, the electronic component 440 comprises an integrated passive device (IPD) including a capacitor, an inductor, a resistor, or a combination thereof. In some embodiments, the electronic component 440 comprises DRAM dies. In some embodiments, the conductive structures 314, 332, 429, 432S, 436S and 440B may have the same or similar structures.

As shown in FIG. 1, the heat dissipating feature 450 is disposed over the semiconductor package assembly 500 and the bases 200A and 200B. In addition, the screen 460 is disposed over the heat dissipating feature 450, and the back plate 452 is disposed below the base 200A. In some embodiments, the heat dissipating feature 450 is arranged to dissipate the heat from the SOC package 300 of the electronic device 600A. The heat dissipating feature 450 is disposed over the second surface 200A2 of the base 200A opposite the semiconductor package assembly 500. In addition, the heat dissipating feature 450 is connected to the silicon capacitor die 400A. Therefore, the heat dissipating feature 450 is connected to the SOC package 300 through the silicon capacitor die 400A and the base 200A.

In some embodiments, the heat dissipating feature 450 includes a thermal interface material (TIM) 442 (or thermal paste), a heat dissipating plate 444 and a carbon-based material film 446. The thermal interface material 442 is in contact with the top surface (i.e., the back surface 432B of the silicon substrate 432) of the silicon capacitor die 400A without there being a gap (air gap) between them. The heat dissipating plate 444 is disposed on and in contact with the thermal interface material 446, so that the thermal interface material 442 is connected between the silicon capacitor die 400A and the heat dissipating plate 444. Therefore, the thermal resistance from the SOC package 300 to the heat dissipating plate 444 can be further reduced. The heat dissipating plate 444 may spread heat in one dimension (e.g., in x-direction or y-direction) or two dimensions (e.g., in both x-direction and y-direction). In addition, the carbon-based material film 446 having excellent thermal conductivity is disposed on (and/or in contact with) the heat dissipating plate 446. In some embodiments, the heat dissipating feature 450 has a size D2 greater than a size D1 of the semiconductor package assembly 500 to improve the heat dissipation capability. Therefore, heat dissipates from the SOC package 300 to the screen 460 (or the outside environment) may enhanced by using the thermal interface material 442 in contact with the silicon capacitor die 400A (filling the air gap (with low thermal conductivity) between the silicon capacitor die 400A and the heat dissipating plate 444). In some embodiments, the thermal interface material 442 consists of a matrix material and large volume fractions of electrically insulating, but thermally conductive filler. For example, the matrix material may include epoxies, silicones, urethanes acrylates, ceramic, metal, another suitable matrix material, or a combination thereof. In addition, adhesive tapes are also available used as the matrix material. For example, the fillers may include aluminum oxide, boron nitride, zinc oxide, or a combination thereof. In some embodiments, the heat dissipating plate 446 includes a vapor chamber, a heat pipe, or a combination thereof. In some embodiments, the carbon-based material film 446 includes single-wall carbon nanotube (CNT) (the thermal conductivity is about 3500 W/m·K) multi-wall carbon nanotube (the thermal conductivity is about 3000 W/m·K), graphene (the thermal conductivity is about 5300 W/m·K) or another applicable carbon-based material.

Figure 2:
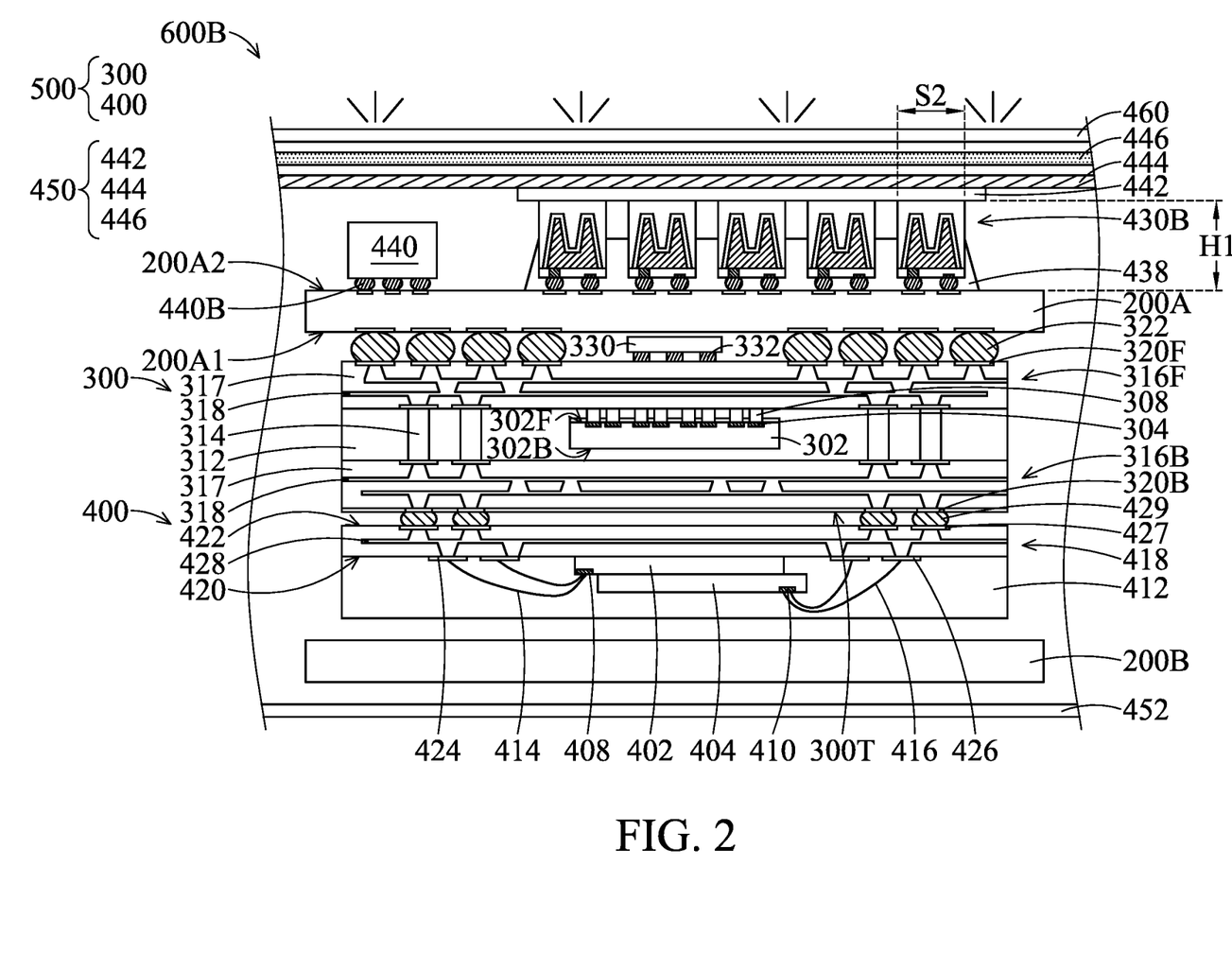

FIG. 2 is a cross-sectional view of an electronic device 600B comprising a semiconductor package assembly 500 in accordance with some embodiments of the disclosure. Elements of the embodiments hereinafter, that are the same or similar as those previously described with reference to FIG. 1 are not repeated for brevity. The electronic device 600B may be designed to uses silicon capacitors with different sizes to achieve the desire capacitance value. The difference between the electronic device 600B and the electronic device 600A is that the electronic device 600B includes one or more discrete silicon capacitor dies 430B stacked on the second surface 200A2 of the base 200A. In some embodiments, the silicon capacitor die 400B may have a size of S2, which is smaller than a size S1 (FIG. 1) of the silicon capacitor dies 400A. Therefore, the capacitance value of silicon capacitor die 400B can be adjusted so that it is different from the capacitance value of silicon capacitor die 400A by changing the size S2 of silicon capacitor die 400B.

Figure 3:
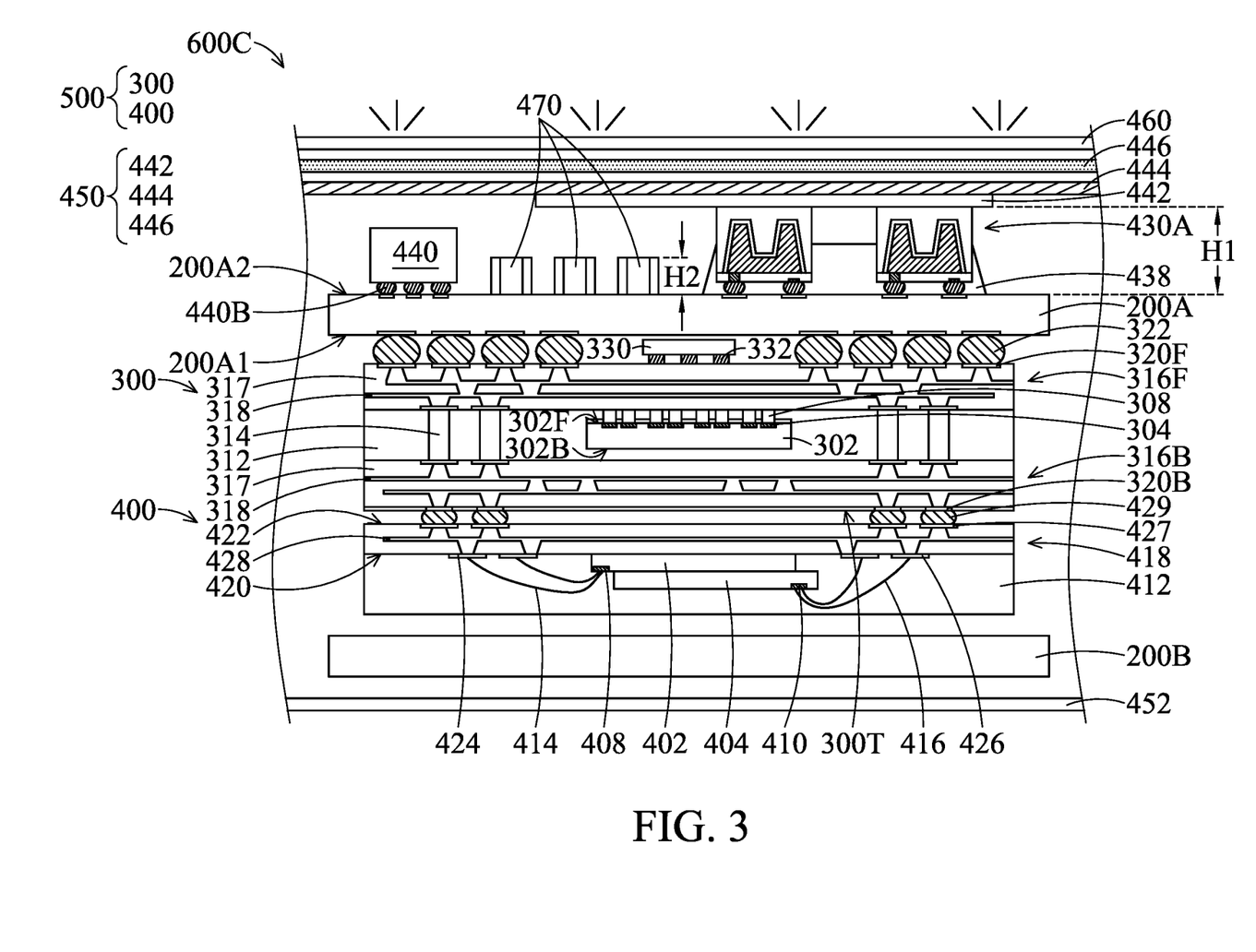

FIG. 3 is a cross-sectional view of an electronic device 600C comprising a semiconductor package assembly 500 in accordance with some embodiments of the disclosure. Elements of the embodiments hereinafter, that are the same or similar as those previously described with reference to FIGS. 1 and 2 are not repeated for brevity. The electronic device 600C may be designed to uses both silicon capacitors and multilayer ceramic capacitor (MLCC) to achieve the goals of cost efficiency and improved thermal performance. The difference between the electronic device 600C and the electronic device 600A is that the electronic device 600C further includes one or more multilayer ceramic capacitor (MLCC) components 470. The MLCC component 470 is mounted on the second surface 200A2 of the base 200A and beside the silicon capacitor die 400A. The MLCC component 470 is electrically connected to the base 200A, the silicon capacitor die 400A and the semiconductor package assembly 500. In some embodiments, the silicon capacitor die 400A has a height H1, the MLCC component 470 has a height H2 that is lower than the height H1 of the silicon capacitor die 400A (because the height of the silicon capacitor die 400A can be adjusted by changing the height of the silicon substrate 432 shown in FIG. 1). Therefore, the thermal interface material 442 may be separated from the MLCC component 470. In other words, a gap is between the MLCC component 470 and the heat dissipating feature 450. In some embodiments, the silicon capacitor die 400A has a first capacitance value, the MLCC component 470 has a second capacitance value that is the same as or different from the first capacitance value of the silicon capacitor die 400A according to the design requirements.

Embodiments provide a semiconductor package assembly and an electronic device. The electronic device includes the semiconductor package assembly, at least one base, at least one silicon capacitor die, a heat dissipating feature and a screen. In some embodiments, the electronic device includes a portion of mobile device including mobile phones, personal digital assistants (PDA), and digital cameras. The semiconductor package assembly provides a system-on-chip (SOC) package and a memory package stacked on it and integrated as a three-dimensional (3D) package-on-package (PoP) semiconductor package assembly. The silicon capacitor die and the semiconductor package assembly are disposed on opposite surfaces of the base. In some embodiments, the electronic device uses one or more silicon capacitor dies to replace the multilayer ceramic capacitor (MLCC) components. The silicon capacitor die has much higher thermal conductivity (about 150 W/m·K) than air (about 0.026 W/m·K) and the MLCC component. Therefore, the silicon capacitor die may serve as a superior heat sink for the system-on-chip (SOC) package. In addition, the silicon capacitor die may serve as an in-situ heat sink of the electronic device. Furthermore, the silicon capacitor die can be fabricated with a desired height (can reach about 700 µm) much greater than that of the MLCC component. In mobile applications, the silicon capacitor die having a greater height can easily be attached to the heat dissipating feature using the thermal interface material (TIM) without there being a gap (air gap) between them, thereby providing a heat dissipating path with low-thermal resistance that can fast dissipates the heat from the SOC package to the screen (or the outside environment) in addition to the original heat dissipating paths (e.g., the conductive paths from the SOC package to the memory package). Therefore, the heat dissipation capability of the semiconductor package assembly and the electronic device can be further improved. In some embodiments, the electronic device may be designed to uses silicon capacitors with various sizes to achieve the desire capacitance value. In some embodiments, the electronic device may be designed to uses both silicon capacitors and multilayer ceramic capacitor (MLCC) to achieve the goals of cost efficiency and improved thermal performance.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
   a base having a first surface and a second surface opposite the first surface;
   a system-on-chip (SOC) package disposed on the first surface of the base, comprising:
   a system-on-chip (SOC) die having pads; and
   a redistribution layer (RDL) structure electrically connected to the system-on-chip (SOC) die by the pads;
   a memory package stacked on the SOC package, comprising:
   a memory package substrate having a top surface and a bottom surface; and
   a memory die mounted on the top surface of the memory package substrate and electrically connected to the memory package substrate; and
   a silicon capacitor die disposed on and electrically connected to the second surface of the base.

2. The semiconductor package assembly as claimed in claim 1, wherein the silicon capacitor die comprises:
   a dielectric material sandwiched between a first electrode and a second electrode, wherein the first electrode is formed by a silicon substrate;
   a first conductive structure and a second conductive structure disposed on a front surface of the silicon substrate and electrically connected to the first electrode and the second electrode.

3. The semiconductor package assembly as claimed in claim 2, wherein a back surface of the silicon substrate forms a top surface of the silicon capacitor die away from the first conductive structure and the second conductive structure.

4. The semiconductor package assembly as claimed in claim 2, wherein the first conductive structure and the second conductive structure are surrounded by an underfill between the silicon capacitor die and the base.

5. The semiconductor package assembly as claimed in claim 4, wherein the underfill surrounds a portion of the silicon substrate.

6. The semiconductor package assembly as claimed in claim 1, further comprising:

an electrical component disposed on the second surface of the base and beside the silicon capacitor die, wherein the electrical component is electrically connected to the base using third conductive structures.

7. The semiconductor package assembly as claimed in claim 6, wherein the electrical component comprises a power management integrated circuit (PMIC), a resistor, an inductor, a dynamic random access memory (DRAM) die, or a combination thereof.

8. The semiconductor package assembly as claimed in claim 1, further comprising:
   a multilayer ceramic capacitor (MLCC) component mounted on the second surface of the base and beside the silicon capacitor die.

9. The semiconductor package assembly as claimed in claim 8, wherein the silicon capacitor die has a first height, and the MLCC component has a second height that is lower than the first height.

10. The semiconductor package assembly as claimed in claim 8, wherein the silicon capacitor die has a first capacitance value, and the MLCC component has a second capacitance value that is the same as the first capacitance value.

11. The semiconductor package assembly as claimed in claim 8, wherein the silicon capacitor die has a first capacitance value, the MLCC component has a second capacitance value that is different from the first capacitance value.

12. The semiconductor package assembly as claimed in claim 1, wherein the SOC package comprises:
    a molding compound surrounding the system-on-chip (SOC) die, which is in contact with the redistribution layer (RDL) structure and the system-on-chip (SOC) die;
    fourth conductive structures passing through the molding compound and electrically connected to the memory package; and
    fifth conductive structures disposed between the redistribution layer (RDL) structure and the base.

13. The semiconductor package assembly as claimed in claim 12, wherein the memory package comprises:
    sixth conductive structures disposed on the bottom surface of the memory package substrate and electrically connected to the SOC package.

14. An electronic device, comprising:
    a first base having a first surface and a second surface opposite the first surface;
    a system-on-chip (SOC) package stacked on the first surface of the first base, comprising:
    a system-on-chip (SOC) die having pads; and
    a redistribution layer (RDL) structure electrically connected to the system-on-chip (SOC) die by the pads;
    a memory package stacked on the SOC package, comprising:
    a memory package substrate having a top surface and a bottom surface; and
    a memory die mounted on the top surface of the memory package substrate and electrically connected to the memory package substrate;
    a silicon capacitor die disposed on the second surface of the first base;
    a heat dissipating feature connected to the silicon capacitor die; and
    a screen disposed over the heat dissipating feature.

15. The electronic device as claimed in claim 14, further comprising:

a second base disposed over and electrically connected to the first base, wherein the SOC package and the memory package are disposed between the first base and the second base.

16. The electronic device as claimed in claim 14, wherein the heat dissipating feature comprises:
  a thermal interface material in contact with the silicon capacitor die;
  a heat dissipating plate disposed on the thermal interface material, so that the thermal interface material is connected between the silicon capacitor die and the heat dissipating plate; and
  a carbon-based material film disposed on the heat dissipating plate.

17. The electronic device as claimed in claim 16, wherein the thermal interface material comprises epoxies, silicones, urethanes, acrylates, ceramic, metal, or a combination thereof.

18. The electronic device as claimed in claim 16, wherein the heat dissipating feature comprises a vapor chamber, a heat pipe, or a combination thereof.

19. The electronic device as claimed in claim 16, wherein the silicon capacitor die comprises:
  a dielectric material sandwiched between a first electrode and a second electrode, wherein the first electrode is formed by a silicon substrate;
  a first electrode pad disposed on and electrically connected to the silicon substrate;
  a second electrode pad disposed on the silicon substrate and electrically connected to the second electrode; and
  a first conductive structure and a second conductive structure disposed on a front surface of the silicon substrate and electrically connected to the first electrode pad and the second electrode pad.

20. The electronic device as claimed in claim 19, wherein a back surface of the silicon substrate forms a top surface of the silicon capacitor die away from the first conductive structure and the second conductive structure.

21. The electronic device as claimed in claim 20, wherein the thermal interface material is in contact with the top surface the silicon capacitor die.

22. The electronic device as claimed in claim 19, wherein the first conductive structure and the second conductive structure are surrounded by an underfill between the silicon capacitor die and the first base.

23. The electronic device as claimed in claim 22, wherein the underfill surrounds a portion of the silicon substrate.

24. The electronic device as claimed in claim 14, further comprising:

an electrical component disposed on the second surface of the first base and beside the silicon capacitor die, wherein the electrical component is electrically connected to the first base using third conductive structures.

25. The electronic device as claimed in claim 24, wherein the electrical component comprises a power management integrated circuit (PMIC), a resistor, an inductor, a dynamic random access memory (DRAM) die, or a combination thereof.

26. The electronic device as claimed in claim 14, further comprising:
  a multilayer ceramic capacitor (MLCC) component mounted on the second surface of the first base and beside the silicon capacitor die.

27. The electronic device as claimed in claim 26, wherein the silicon capacitor die has a first height, and the MLCC component has a second height that is lower than the first height.

28. The electronic device as claimed in claim 26, wherein the silicon capacitor die has a first capacitance value, and the MLCC component has a second capacitance value that is the same as the first capacitance value.

29. The electronic device as claimed in claim 26, wherein the silicon capacitor die has a first capacitance value, and the MLCC component has a second capacitance value that is different from the first capacitance value.

30. The electronic device as claimed in claim 14, wherein the SOC package comprises:
  a molding compound surrounding the system-on-chip (SOC) die, which is in contact with the redistribution layer (RDL) structure and the system-on-chip (SOC) die;
  fourth conductive structures passing through the molding compound and electrically connected to the memory package; and
  fifth conductive structures disposed between the redistribution layer (RDL) structure and the first base, and
  wherein the memory package comprises:
  sixth conductive structures disposed on the bottom surface of the memory package substrate and electrically connected to the SOC package.

31. The electronic device as claimed in claim 14, further comprising:
  a back plate disposed over the SOC package and the memory package opposite the screen.

* * * * *